(12) United States Patent
Wu et al.

(10) Patent No.: US 9,449,976 B2
(45) Date of Patent: Sep. 20, 2016

(54) SEMICONDUCTOR DEVICE STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Chun-Ching Wu, Tainan (TW); Hsiang-Hui Tsai, Tainan (TW); Po-Jen Wang, Taichung (TW); Hung-Che Liao, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 14/104,987

(22) Filed: Dec. 12, 2013

(65) Prior Publication Data

US 2015/0171087 A1 Jun. 18, 2015

(51) Int. Cl.
*H01L 29/76* (2006.01)
*H01L 27/092* (2006.01)
*H01L 21/8238* (2006.01)

(52) U.S. Cl.
CPC ... *H01L 27/0928* (2013.01); *H01L 21/823878* (2013.01); *H01L 21/823892* (2013.01)

(58) Field of Classification Search
CPC .............. H01L 21/823878; H01L 21/823892; H01L 27/0928

USPC .......... 257/369, 372–376, E21.632, E27.064
See application file for complete search history.

(56) References Cited

U.S. PATENT DOCUMENTS

| | | | |
|---|---|---|---|
| 5,929,695 A * | 7/1999 | Chan ...................... G05F 3/205 | 326/36 |
| 8,198,700 B2 | 6/2012 | Koburger, III et al. | |
| 2004/0079999 A1* | 4/2004 | Shibata et al. ................ | 257/371 |
| 2012/0175708 A1* | 7/2012 | Schuetz ............. H01L 27/0928 | 257/369 |

* cited by examiner

*Primary Examiner* — H Tsai
(74) *Attorney, Agent, or Firm* — McDermott Will & Emery LLP

(57) ABSTRACT

A novel semiconductor device structure includes a first-conductivity-type semiconductor substrate, an isolated region, a first-conductivity-type MOS region, and a second-conductivity-type MOS region. A first-conductivity-type MOS transistor locates in the first-conductivity-type MOS region with a second-conductivity-type well surrounding, and a first-conductivity-type deep well surrounding the second-conductivity-type well with a second-conductivity-type deep well surrounding. In the second-conductivity-type MOS region, a second-conductivity-type MOS transistor is formed with a first-conductivity-type well surrounding. The first-conductivity-type deep well and the second-conductivity-type deep well are sufficiently reducing the noise and current leakage from other devices or from the semiconductor substrate.

19 Claims, 7 Drawing Sheets

SEMICONDUCTOR DEVICE STRUCTURE AND METHOD FOR MANUFACTURING THE SAME

BACKGROUND

A transistor s an element that is utilized extensively in semiconductor devices. There may be millions of transistors on a single integrated circuit (IC). A common type of transistor used in semiconductor device fabrication is a metal oxide semiconductor field effect transistor (MOSFET) with either P or N channel transistors. A complementary MOS (CMOS) devices use both positive and negative channel devices in complementary configurations. N-type metal oxide semiconductors (NMOS) are fabricated within P-type wells within a P-type substrate; P-type metal oxide semiconductors (PMOS) within N-type wells situated within the same P-type substrate.

With the increased density of devices and the combination of various types of circuitry, such as logic and radio frequency processing circuits, noise generated in the ICs becomes intense. Such noise is detrimental in the ICs because the integrity of a signal may be compromised, which causes a loss of data or errors in logic or signal processing. In CMOS structures, noise from other nearby devices would interfere with the circuit function, and substrate noise coupling is also an effect that is of concern because it can adversely affect the operation of various other devices. In this regard, transistors in the CMOS structures often require isolation from each other to prevent disturbance from unwanted noise. In the NMOS, deep N-wells surrounding the P-type wells region may be used to electrically shield the device against possible perturbations of noise from those devices. The P/N junction diodes formed between the deep N-well regions and the P-type substrate prevent current flow and the deep N-wells also act as an electrical potential shield.

However, Since N-type wells naturally reduce the noise disturbance from P-type substrate due to small nature P/N junction diodes, the P-type transistors located in the N-type wells still have higher noise disturbance from the P-type substrate than N-type transistors located in the P-type wells within the deep N-wells. The noise and leak current from substrate will have big impact on the operation of the CMOS.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
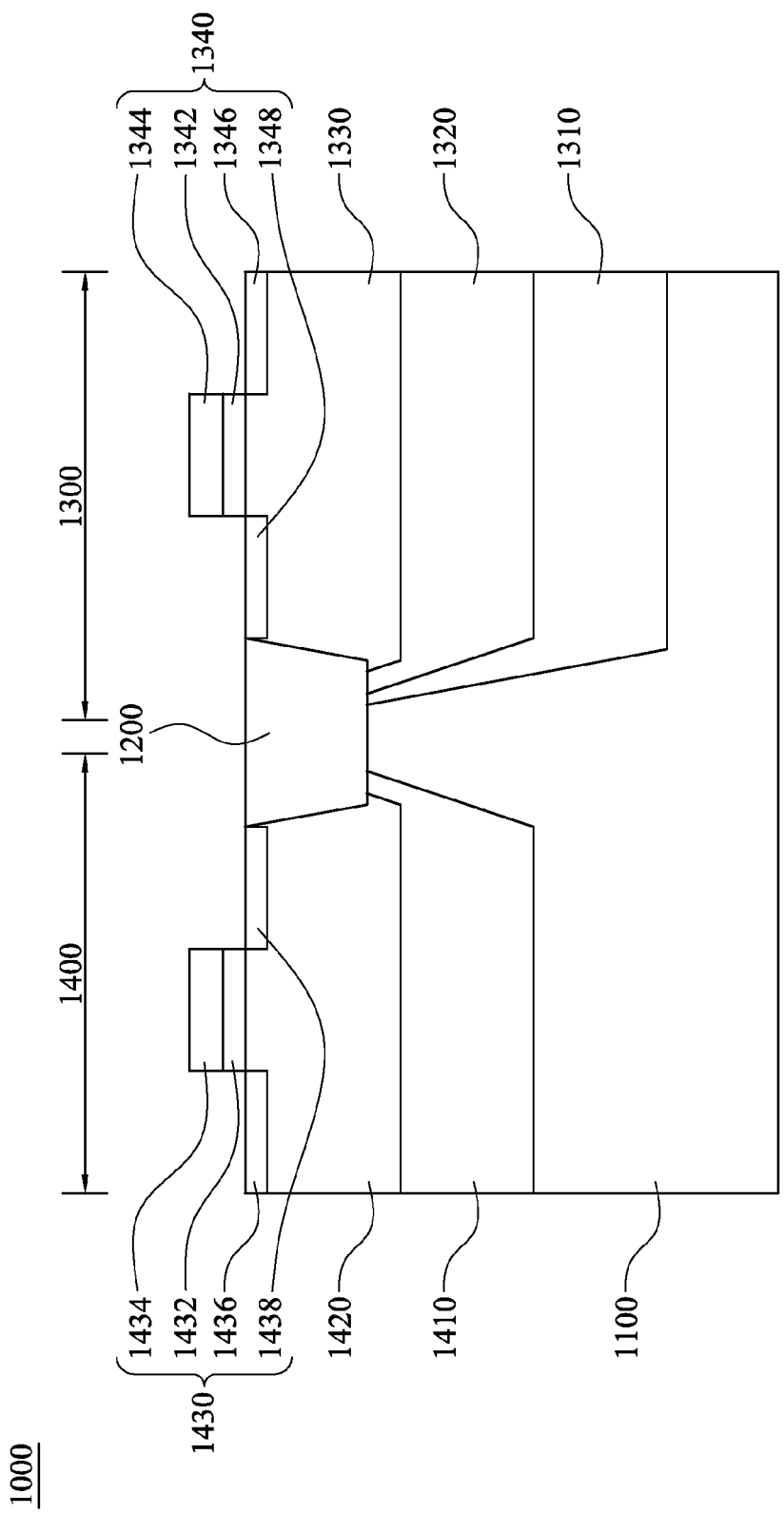
FIG. 1 is a cross-sectional view of a CMOS semiconductor structure according to various embodiments of the present disclosure.

The embodiments of semiconductor structures and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a semiconductor well includes embodiments having two or more such semiconductor wells, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Modern CMOS technology is capable of providing transistors having the capability of operating at frequencies of 1 GHZ or more. This enables CMOS to provide functionality in radio frequency (RF) communications. RF-CMOS semiconductor structures can be used for the detection, processing or transmission of radio waves or microwaves having a frequency range about 10 kHz to 1000 GHz. These circuits need to be made from high switching speed capable components operating usefully at radio wave. But noise disturbance from other devices and the semiconductor substrate can cause a loss of data or errors in logic or signal processing in the RF-CMOS semiconductor structures. Therefore, reducing the noise disturbance to promote the RF-CMOS semiconductor structures efficiency is important.

The general CMOS semiconductor structure includes a first-conductivity-type, e.g., an N-type or a P-type, semiconductor substrate and an isolated region separating the first-conductivity-type semiconductor substrate into a first-conductivity-type MOS region and a second-conductivity-type MOS region. Generally, the second-conductivity-type deep well in the second-conductivity-type MOS region reduces the noise and leak current from the semiconductor substrate into a second-conductivity-type MOS transistor. But in the first-conductivity-type MOS region, without the deep well protection, the transistor is still under noise disturbance propagation from the semiconductor substrate.

According to various embodiments of the present disclosure, a RF-CMOS transistor in a semiconductor substrate is provided to have low noise disturbance. Referring to FIG. 1, a RF-CMOS semiconductor structure 1000 includes a first-conductivity-type semiconductor substrate 1100, and an isolated region 1200 separating the first-conductivity-type semiconductor substrate 1100 into a first-conductivity-type MOS region 1300 and a second-conductivity-type MOS region 1400. The first-conductivity-type MOS region 1300 has a second-conductivity-type deep well 1310, a first-conductivity-type deep well 1320, a second-conductivity-type well 1330, and a first-conductivity-type MOS transistor 1340. The second-conductivity-type MOS region 1400 has a second-conductivity-type deep well 1410, a first-conductivity-type well 1420, and a second-conductivity-type MOS transistor 1430.

The first-conductivity-type semiconductor substrate 1100 may be made of semiconductor material such as silicon, germanium, silicon germanium, silicon carbide, and those consisting essentially of III-V compound semiconductors (e.g., GaAs and Si/Ge). In embodiments, the first-conductivity-type semiconductor substrate 1100 is slightly doped with the first-conductivity-type dopants.

In embodiments, the isolated region 1200 is a shallow trench isolation (STI) structure.

The second-conductivity-type deep well 1410 in the second-conductivity-type MOS region 1400 has opposite conductivity type to the first-conductivity-type semiconductor substrate 1100. Then any noise contributions from the first-conductivity-type semiconductor substrate 1100 cannot interfere with the signals of the second-conductivity-type MOS transistor 1430. Because the P/N junction between the opposite conductivity type regions forms the diode protection shields noise disturbance. Where the P/N junction diode only permits the electrical flow from the P-type semiconductor into the N-type semiconductor.

A particular feature in the embodiments is that the RF-CMOS semiconductor structure 1000 also has a second-conductivity-type deep well 1310 in the first-conductivity-type MOS region 1300, and furthermore a first-conductivity-type deep well 1320 within the second-conductivity-type deep well 1310. Because the P/N junction diode forms between the regions with opposite conductivity type, there will form two P/N junction diodes. One is located at the interface between the first-conductivity-type semiconductor substrate 1100 and the second-conductivity-type deep well 1310, and another is located at the interface between the first-conductivity-type deep well 1320 and the second-conductivity-type deep well 1310. The P/N junction diodes insurance the first-conductivity-type MOS transistor 1340 against possible perturbations of noise from those devices outside it or from the first-conductivity-type semiconductor substrate 1100.

In the first-conductivity-type MOS region 1300, the P/N junction diode also forms between the second-conductivity-type well 1330 and the first-conductivity-type deep well 1320. In the second-conductivity-type MOS region 1400, the P/N junction diode also forms between the first-conductivity-type well 1420 and the second-conductivity-type deep well 1410. The P/N junction diodes here enhance the noise reduction ability and to protect the sensitive transistors 1340 and 1430 within the well region.

The first-conductivity-type well 1420, and the first-conductivity-type deep well 1320 may be lightly or intermediately doped with dopants of the first-conductivity-type. The dopant concentration may depend on the maximum voltage requirement of the RF-CMOS semiconductor structure 1000.

The second-conductivity-type well 1330, the second-conductivity-type deep well 1310 in the first-conductivity-type MOS region 1300, and the second-conductivity-type deep well 1410 in the second-conductivity-type MOS region 1400 may be lightly or intermediately doped with dopants of the second-conductivity-type. The dopant concentration may depend on the maximum voltage requirement of the RF-CMOS semiconductor structure 1100.

The first-conductivity-type MOS transistor 1340 also includes a first gate oxide layer 1342, a first gate 1344, a first-conductivity-type source 1346, and a first-conductivity-type drain 1348.

The second-conductivity-type MOS transistor 1430 also includes a second gate oxide layer 1432, a second gate 1434, a second-conductivity-type source 1436, and a second-conductivity-type drain 1438.

The first gate oxide layer 1342 is located above the second-conductivity-type well 1330 and the second gate oxide layer 1432 is located above the first-conductivity-type well 1420. In embodiments, the gate oxide layers 1342 and 1432 are made of silicon dioxide, and having a thickness in a range of 10 to 5000 angstroms, depending on operating voltage of the first gate 1344 and the second gate 1434.

The first gate 1344 and the second gate 1434 are respectively disposed on the first gate oxide layer 1342 and the second gate oxide layer 1432. In embodiments, the first gate 1344 and the second gate 1434 are made of polysilicon.

The first-conductivity-type source 1346 and the first-conductivity-type drain 1348 are respectively within the second-conductivity-type well 1330 and on opposite sides of the first gate 1344. The first-conductivity-type source 1346 and the first-conductivity-type drain 1348 are heavily doped with the first-conductivity-type dopants.

The second-conductivity-type source 1436 and the second-conductivity-type drain 1438 are respectively within the first-conductivity-type well 1420 and on opposite sides of the second gate 1434. The second-conductivity-type source 1436 and the second-conductivity-type drain 1438 are heavily doped with the second-conductivity-type dopants.

In embodiments, the first-conductivity-type is an N-type and the second-conductivity-type is a P-type, or the first-conductivity-type is a P-type and the second-conductivity-type is an N-type.

In embodiments, N-type dopants such as arsenic, phosphorus, antimony or a combination thereof are used for doping N-type regions. And P-type dopants such as boron, gallium, indium or a combination thereof are used for doping P-type regions.

Figure 2:
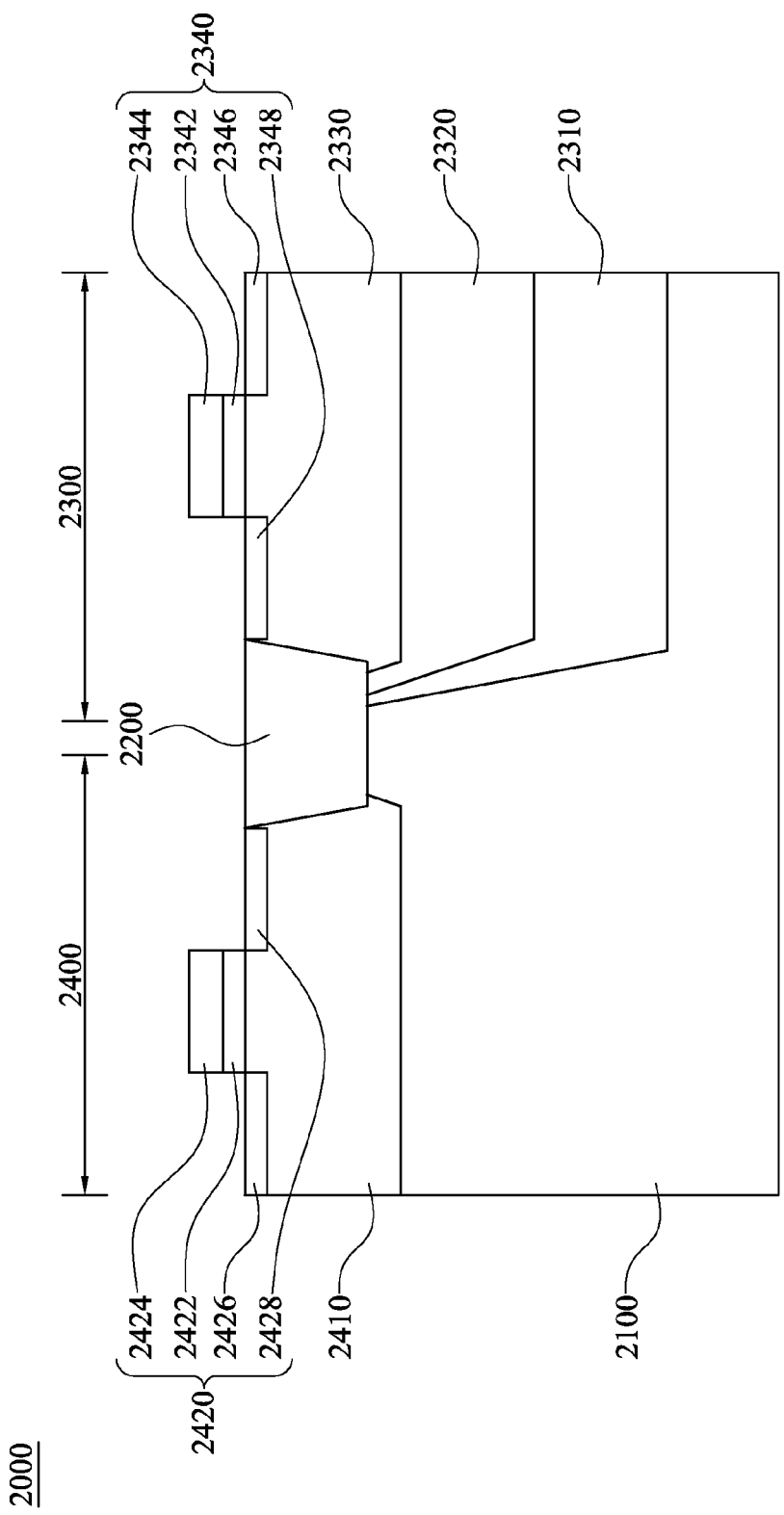
FIG. 2 is a cross-sectional view of a CMOS semiconductor structure according to various embodiments of the present disclosure.

FIG. 2 is a cross-sectional view of a RF-CMOS semiconductor structure 2000 according to some embodiments of the present disclosure. Among the RF-CMOS semiconductor structure 2000, the first-conductivity-type is an N-type and the second-conductivity-type is a P-type. The RF-CMOS semiconductor structure 2000 includes an N-type semiconductor substrate 2100, and an isolated region 2200 separating the N-type semiconductor substrate 2100 into an NMOS region 2300 and a PMOS region 2400. The NMOS region 2300 has a P-type deep well 2310, an N-type deep well 2320, a P-type well 2330, and an NMOS transistor 2340. The PMOS region 2400 has an N-type well 2410, and a PMOS transistor 2420.

The NMOS transistor 2340 also includes a gate oxide layer 2342, a gate 2344, an N-type source 2346, and an N-type drain 2348. And the PMOS transistor 2420 also includes a gate oxide layer 2422, a gate 2424, a P-type source 2426, and a P-type drain 2428.

FIGS. 3A-3E are cross-sectional views at various stages of manufacturing the RF-CMOS semiconductor structure 1000 according to various embodiments of the present disclosure. To clarify description and avoid repetition, like numerals and letters used to describe the RF-CMOS semiconductor structure 1000 above are used for the various elements in the coming figures. Also, reference numerals described previously may not be described again in detail herein.

Figure 3A:
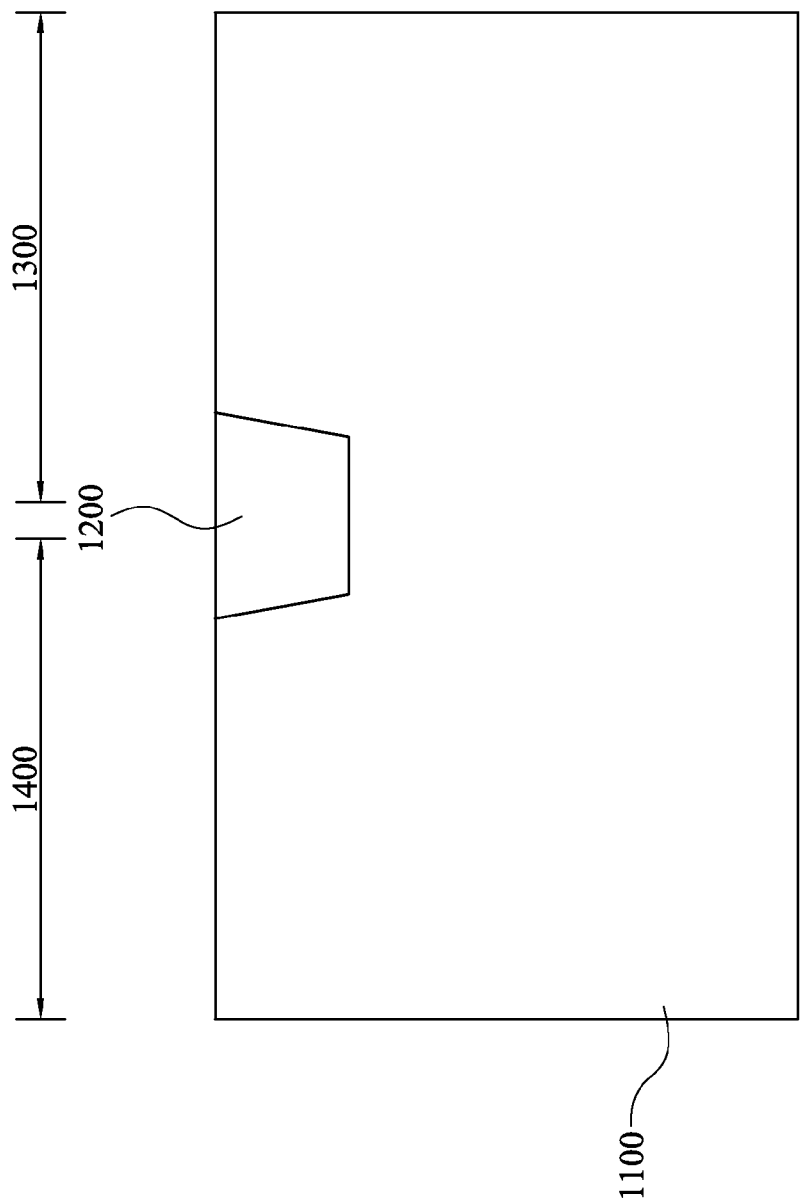
FIG. 3A-E are cross-sectional views at various stages of manufacturing a CMOS semiconductor structure according to various embodiments of the present disclosure.

As shown in FIG. 3A, a first-conductivity-type semiconductor substrate 1100 is provided, and an isolate region 1200 is formed to separated the first-conductivity-type semiconductor substrate 1100 into a first-conductivity-type MOS region 1300 and a second-conductivity-type MOS region 1400. In embodiments, the isolated region 1200 is formed by a STI process sequence. In which, trench (commonly 200 to 500 nanometers deep) is etched into the first-conductivity-type semiconductor substrate 1100, electrically passivated, (commonly by growing a thermal oxide layer on sidewalls of the trenches) and filled with insulating material, typically silicon dioxide. The method includes a high density plasma (HDP) process or an ozone based thermal chemical vapor deposition (CVD) process.

Figure 3B:
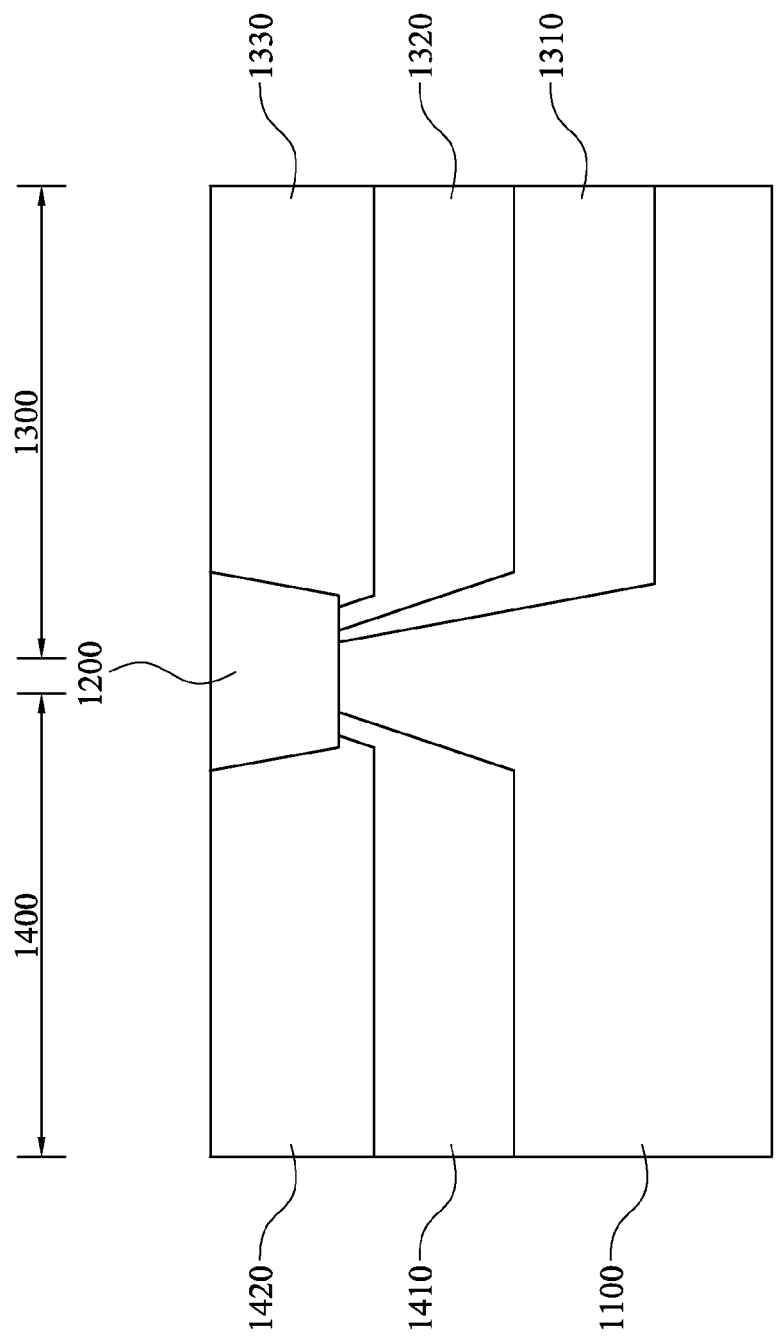

Continuing in FIG. 3B, in the first-conductivity-type MOS region 1300, a second-conductivity-type deep well 1310, a first-conductivity-type deep well 1320, and a second-conductivity-type well 1330 are then formed therein. On the other side, a second-conductivity-type deep well 1410 and a first-conductivity-type well 1420 are formed in the second-conductivity-type MOS region 1400.

In embodiments, the first-conductivity-type well 1420 and the first-conductivity-type deep well 1320 are formed by implanting dopants of the first-conductivity-type in selective areas of the first-conductivity-type semiconductor substrate 1100. The second-conductivity-type well 1330 and the second-conductivity-type deep wells 1310 and 1410 are formed by implanting dopants of the second-conductivity-type in another selective areas of the first-conductivity-type semiconductor substrate 1100 prior or next to the step of forming the first-conductivity-type well 1420 and the first-conductivity-type deep well 1320.

Figure 3C:
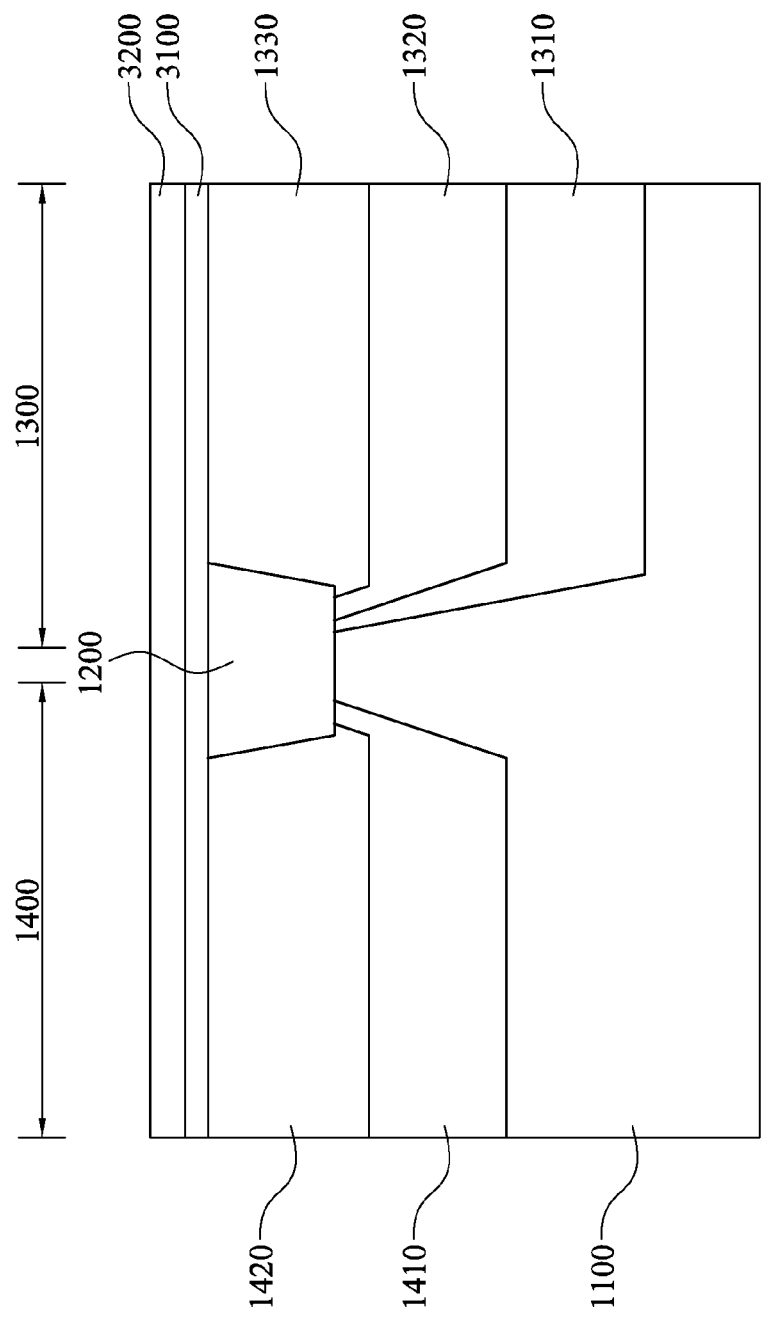

Referring now to FIG. 3C, an oxide layer 3100 is formed covering the surface of the first-conductivity-type semiconductor substrate 1100 by thermally grown or deposition. Then a gate material layer 3200 is formed covering the surface of the oxide layer 3100 by low pressure chemical vapor deposition (LPCVD).

Figure 3D:
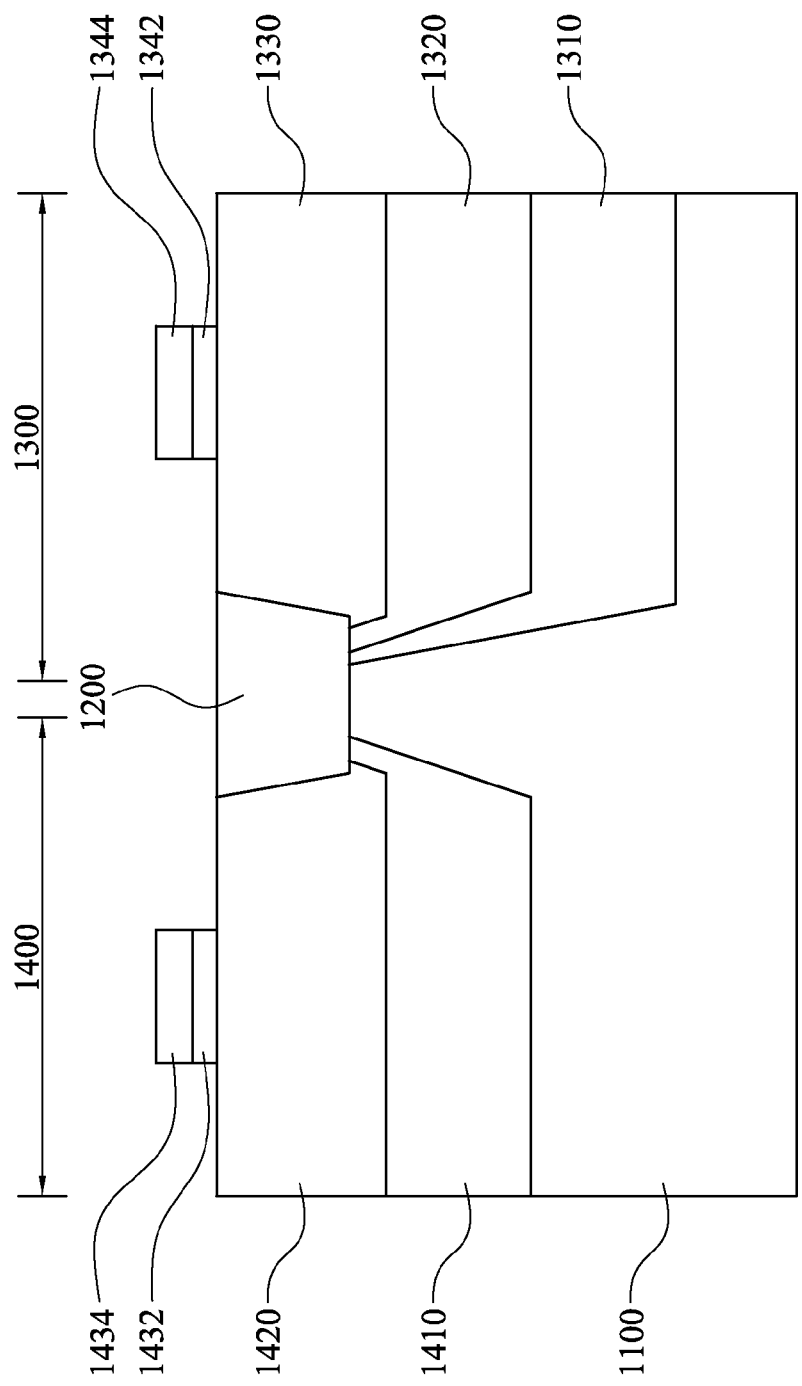

Continuing in FIG. 3D, a first gate oxide layer 1342 is formed above the second-conductivity-type well 1330 and a second gate oxide layer 1432 is formed above the first-conductivity-type well 1420. A first gate 1344 and a second gate 1434 are formed respectively on the first gate oxide layer 1342 and on the second gate oxide layer 1432. In embodiments, the first gate oxide layer 1342, the second gate oxide layer 1432, the first gate 1344, and the second gate 1434 are formed with the method of selectively etching the oxide layer 3100 and the gate material layer 3200 region which without photoresist protection.

Figure 3E:
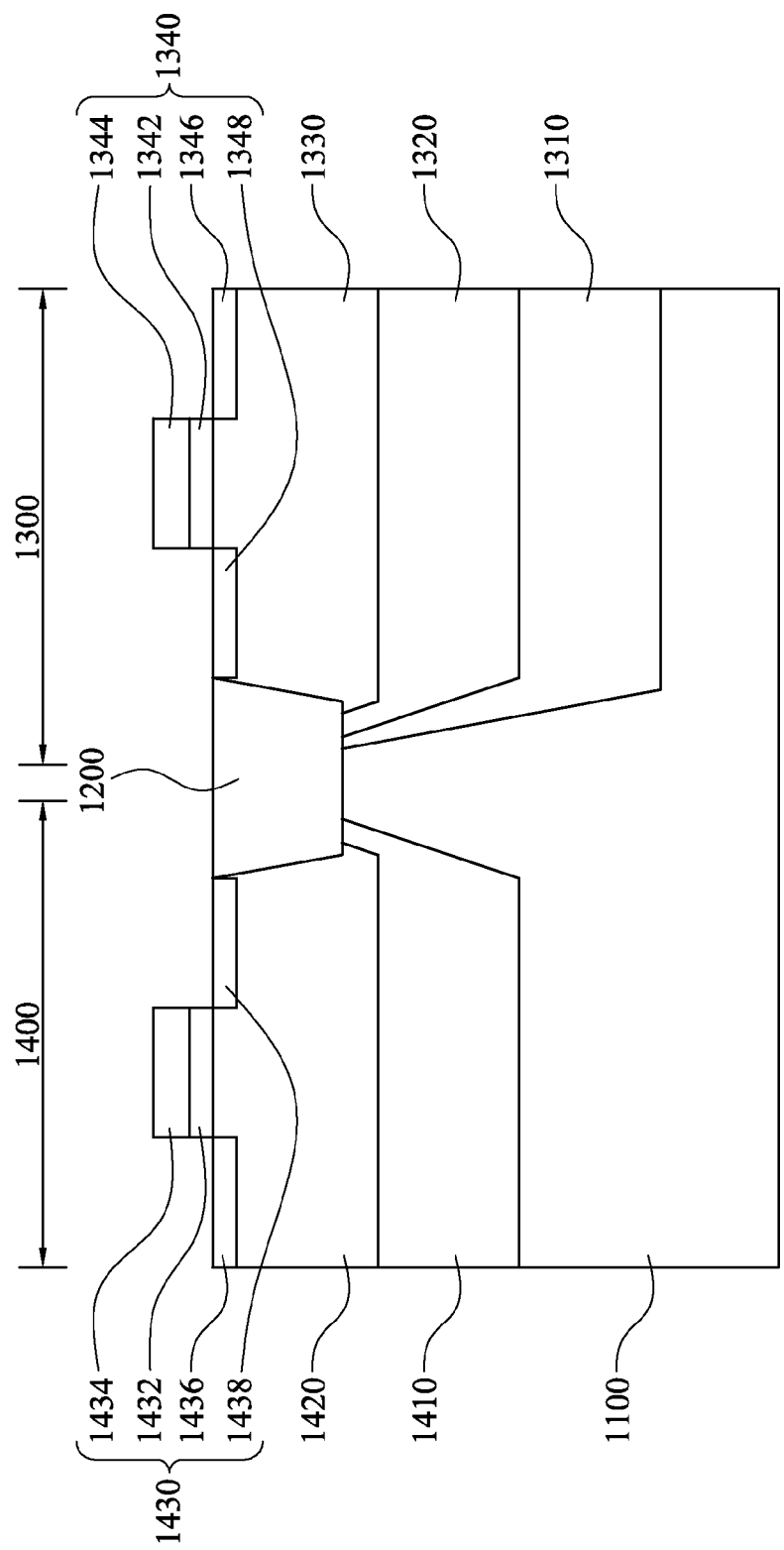

As shown in FIG. 3E, a first-conductivity-type source 1346 and a first-conductivity-type drain 1348 are formed on opposite sides of the first gate 1344, and a second-conductivity-type source 1436 and a second-conductivity-type drain 1438 are formed on opposite sides of the second gate 1434 by any conventional method. In embodiments, an ion implantation process is performed by implanting the first-conductivity-type dopants into the selective areas within the second-conductivity-type well 1330, and implanting the second-conductivity-type dopants into the selective areas within the first-conductivity-type well 1420.

The embodiments of the present disclosure discussed above have advantages over existing structures and methods, and the advantages are summarized below. In various embodiments, the second-conductivity-type deep well 1310 and the first-conductivity-type deep well 1320 in the first-conductivity-type MOS region 1300 increasingly reduce the noise disturbance from the first-conductivity-type semiconductor substrate 1100, which protect the first-conductivity-type MOS transistor 1340 in the first-conductivity-type MOS region 1300. The P/N junction diodes forming at the interface between the opposite conductivity type region resist the unwanted noise and leak current from other devices, or the semiconductor substrate. It will be helpful for noise reduction and improve the signal noise (SN) ratio on sensitive RF-CMOS semiconductor structures.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device structure, comprising:
   a first-conductivity-type semiconductor substrate;
   a first-conductivity-type metal oxide semiconductor (MOS) region comprising:
   a first-conductivity-type MOS transistor;
   a second-conductivity-type well surrounding the first-conductivity-type MOS transistor;
   a first-conductivity-type deep well surrounding the second-conductivity-type well; and
   a second-conductivity-type deep well surrounding the first-conductivity-type deep well;
   a second-conductivity-type MOS region comprising:
   a second-conductivity-type MOS transistor;
   a first-conductivity-type well surrounding the second-conductivity-type MOS transistor, the first-conductivity-type well being electrically isolated from the second-conductivity-type well; and
   a second-conductivity-type deep well surrounding the first-conductivity-type well, and the second-conductivity-type deep well in the second-conductivity-type MOS region being separated from the second-conductivity-type deep well in the first-conductivity-type MOS region; and
   an isolated region separating the first-conductivity-type MOS region and the second-conductivity-type MOS region.

2. The semiconductor device structure of claim 1, wherein the first-conductivity-type MOS transistor comprises a first source, a first drain, a first gate, and a first gate oxide layer.

3. The semiconductor device structure of claim 2, wherein the first source and the first drain are doped with the first-conductivity-type dopants.

4. The semiconductor device structure of claim 1, wherein the second-conductivity-type MOS transistor comprises a second source, a second drain, a second gate, and a second gate oxide layer.

5. The semiconductor device structure of claim 4, wherein the second source and the second drain are doped with the second-conductivity-type dopants.

6. The semiconductor device structure of claim 4, wherein the first gate oxide layer and the second gate oxide layer are made of silicon dioxide.

7. The semiconductor device structure of claim 1, wherein the first-conductivity-type is a P-type and the second-conductivity-type is an N-type.

8. The semiconductor device structure of claim 1, wherein the first-conductivity-type is an N-type and the second-conductivity-type is a P-type.

9. The semiconductor device structure of claim 1, wherein the isolated region is an inter-well shallow trench isolation (STI) structure.

10. A semiconductor device structure, comprising:
a P-type semiconductor substrate;
a P-type metal oxide semiconductor (PMOS) region comprising:
a PMOS transistor;
an N-type well surrounding the PMOS transistor;
a P-type deep well surrounding the N-type well; and
an N-type deep well surrounding the P-type deep well;
an N-type metal oxide semiconductor (NMOS) region comprising:
an NMOS transistor;
a P-type well surrounding the NMOS transistor, the P-type well being electrically isolated from the N-type well; and
an N-type deep well surrounding the P-type well, and the N-type deep well in the NMOS region being separated from the N-type deep well in the PMOS region; and
an isolated region separating the NMOS region and the PMOS region.

11. The semiconductor device structure of claim 1, further comprising P/N junction diodes located at an interface between the first-conductivity-type semiconductor substrate and the second-conductivity-type deep well of the second-conductivity-type MOS region.

12. The semiconductor device structure of claim 1, further comprising P/N junction diodes located at an interface between the first-conductivity-type semiconductor substrate and the second-conductivity-type deep well of the first-conductivity-type MOS region.

13. The semiconductor device structure of claim 1, wherein the first-conductivity-type MOS region further comprises P/N junction diodes between the second-conductivity-type deep well and the first-conductivity-type deep well and between the second-conductivity-type well and the first-conductivity-type deep well.

14. The semiconductor device structure of claim 1, wherein the second-conductivity-type MOS region further comprises P/N junction diodes between the first-conductivity-type well and the second-conductivity-type deep well.

15. The semiconductor device structure of claim 10, wherein the NMOS transistor comprises a gate oxide layer, a gate, an N-type source, and an N-type drain.

16. The semiconductor device structure of claim 10, wherein the PMOS transistor comprises a gate oxide layer, a gate, a P-type source, and a P-type drain.

17. The semiconductor device structure of claim 15, wherein the N-type source and the N-type drain are doped with arsenic, phosphorus, antimony, or a combination thereof.

18. The semiconductor device structure of claim 16, wherein the P-type source and the P-type drain are doped with boron, gallium, indium, or a combination thereof.

19. The semiconductor device structure of claim 10, wherein the isolated region is an inter-well shallow trench isolation (STI) structure.

* * * * *